United States Patent [19]
Ikeda

[11] Patent Number: 5,436,501
[45] Date of Patent: Jul. 25, 1995

[54] COOLING STRUCTURE FOR INTEGRATED CIRCUIT

[75] Inventor: Hironobu Ikeda, Tokyo, Japan

[73] Assignee: NEC Corporation, Tokyo, Japan

[21] Appl. No.: 14,257

[22] Filed: Feb. 5, 1993

[30] Foreign Application Priority Data

Feb. 5, 1992 [JP] Japan .................. 4-054449

[51] Int. Cl.⁶ .......................... H01L 25/04
[52] U.S. Cl. .................. 257/714; 165/80.4; 361/699
[58] Field of Search ............. 257/714, 713, 712, 716; 165/80.4; 361/385

[56] References Cited

U.S. PATENT DOCUMENTS

| | | | |
|---|---|---|---|
| 4,138,692 | 2/1979 | Meeker et al. | 357/82 |
| 4,245,273 | 1/1981 | Feinberg et al. | 361/382 |
| 4,573,067 | 2/1986 | Tuckerman et al. | 257/714 |
| 4,649,990 | 3/1987 | Kurihara et al. | 165/80.4 |
| 4,734,820 | 3/1988 | Lauffer et al. | 361/385 |
| 4,750,056 | 6/1988 | Mittal et al. | 257/714 |
| 4,805,420 | 2/1989 | Porter et al. | 62/514 R |
| 4,870,477 | 9/1989 | Nakanishi et al. | 357/82 |
| 4,884,169 | 11/1989 | Cutchaw | 257/713 |
| 4,897,762 | 1/1990 | Daikaku et al. | 257/714 |
| 4,977,443 | 12/1990 | Kobayashi et al. | 357/82 |
| 4,977,444 | 12/1990 | Nakajima et al. | 357/82 |
| 4,980,754 | 12/1990 | Kotani et al. | 257/716 |
| 5,023,695 | 6/1991 | Umezawa et al. | 257/714 |
| 5,166,863 | 11/1992 | Shmunis | 361/385 |

FOREIGN PATENT DOCUMENTS

| | | | |
|---|---|---|---|
| 2100350 | 4/1990 | Japan | 257/714 |
| 3270259 | 12/1991 | Japan | 257/714 |

Primary Examiner—Rolf Hille
Assistant Examiner—Teresa M. Arroyo
Attorney, Agent, or Firm—Sughrue, Mion, Zinn, Macpeak & Seas

[57] ABSTRACT

A cooling structure for an integrated circuit that uses a liquid coolant to absorb heat directly from the integrated circuit includes a wiring substrate, an integrated circuit mounted on the wiring substrate, and a hollow cooling block, in which liquid coolant accumulates, disposed on a heat radiating surface of the integrated circuit. The upper portion of the cooling block is provided with an inlet port and an outlet port to allow the liquid coolant to enter and exit, respectively. A nozzle is mounted on the inlet port to jet the liquid coolant to the heat radiating surface. The lower portion of the cooling block consists of an opening portion which is opposed to the heat radiating surface, and which allows the liquid coolant to come in contact with and directly cool the heat radiating surface. The opening portion is liquid-tightly sealed to the heat radiating surface by a sealing member and/or a frame mounted on the heat radiating surface.

13 Claims, 3 Drawing Sheets

COOLING STRUCTURE FOR INTEGRATED CIRCUIT

BACKGROUND OF THE INVENTION

The present invention relates to a cooling structure for an integrated circuit to be used in an electronic device such as a data processor and, particularly, to a cooling structure in which an integrated circuit is cooled by circulating liquid coolant in the vicinity of the integrated circuit and absorbing heat generated by the integrated circuit by liquid coolant.

Examples of a conventional cooling structure for integrated circuit of this type are disclosed in "A Conduction-Cooled Module for High Performance LSI Devices" by S. Oktay and H. C. Kammerer, published in IBM *J. RES. DEVELOP.*, Vol. 26, No. 1, Jan. 1982 and in Japanese Patent Application Disclosure No. Sho 60-160150.

The former example shows a first conventional structure in which a semi-spherical contact surface of a piston is pressed to a heat radiating surface of an integrated circuit formed on a wiring substrate by spring force to transmit heat generated in the integrated circuit through the piston, a gap filled with helium gas, a hat and an intermediate layer and, after heat is transmitted from the intermediate layer to a cooling plate, the latter is cooled by a coolant.

The latter example shows a second conventional cooling structure in which a heat conductive substrate, a deformable heat conductive member and a heat conductive plate are provided on a heat radiating surface of a chip on a printed circuit substrate and a thin-walled, elastically deformable bellow is provided on the heat conductive plate cooling is performed by jetting liquid coolant from a nozzle to the heat conductive plate within the bellow.

The cooling structure of the conventional integrated circuit which are disclosed in the above mentioned articles has defects which will be described below.

First, in the first conventional structure, the piston is always urged to the heat radiating surface of the integrated circuit by resilient force of the spring and therefore a load is exerted on a connecting portion between the integrated circuit and the wiring substrate, degrading reliability of the connecting portion.

Second, in the first conventional structure, in order to follow variations in height and tilting of the integrated circuit which may be caused when it is mounted on the wiring substrate, the contact surface of the piston with the integrated circuit is made spherical and a gap is provided between the hat and the piston.

As a result, an effective heat conducting area is reduced, resulting in degraded total cooling performance of the cooling structure.

Third, heat conduction coefficient obtainable in the first conventional structure is in the order of 0.1 to 0.5 [W/cm$^2$° C.] since heat conduction is performed by forced convention of coolant in the coolant passage within the cooling plate. Therefore, the cooling capacity thereof may become insufficient when power consumption is increased with an increase of integration density of the integrated circuit.

Fourth, since, in the second conventional structure, the heat conducting substrate, the deformable heat conductor and the heat conducting plate are provided between the liquid coolant jetted from the nozzle and the chip which is the source of heat, it is very difficult to obtain high heat transmission, thus causing the cooling capability of the cooling structure to be low.

SUMMARY OF THE INVENTION

An object of the present invention is to provide a cooling structure for use in an integrated circuit, which has a minimum heat resistance between the integrated circuit and coolant.

According to the present invention, the cooling structure for integrated circuit comprises a wiring substrate, an integrated circuit mounted on the wiring substrate, a cooling block having an inlet port and an outlet port for liquid coolant in an upper portion thereof, an opening portion on the side thereof opposing to a heat radiating surface of the integrated circuit and an interior accumulating the liquid coolant, means for fixedly securing the opening portion of the cooling block to the heat radiating surface of the integrated circuit and means mounted on the inlet port of the cooling block for jetting the liquid coolant to the heat radiating surface of the integrated circuit.

BRIEF DESCRIPTION OF THE DRAWINGS

The features and advantages of the present invention will become apparent from the following description when taken in conjunction with the accompanying drawings in which.

In these drawings, same reference numerals depict same constitutional components, respectively.

DETAILED DESCRIPTION OF THE PREFERRED EMBODIMENTS

First of all, in order to facilitate understanding of an object, construction and operation of the cooling structure according to the present invention, a conventional cooling structure of an integrated circuit will be described with reference to the drawings.

Figure 8:
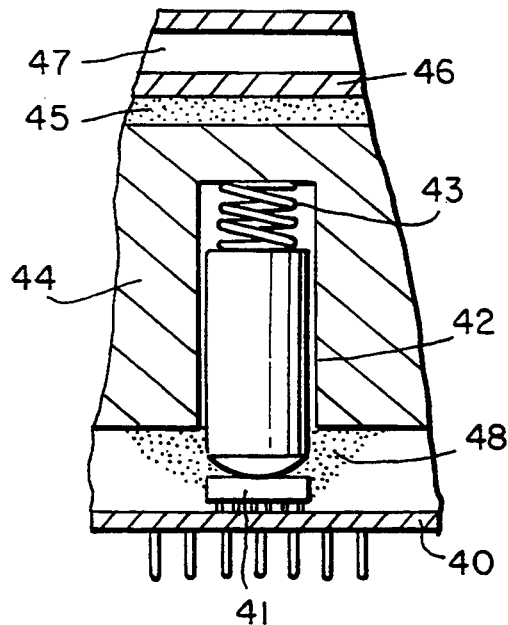
FIG. 8 is a longitudinal cross section of a conventional cooling structure for an integrated circuit.

Referring to FIG. 8, a conventional cooling structure comprises a wiring substrate 40 having I/O pins, a plurality of integrated circuits 41 (only one of them is shown) mounted on the wiring substrate 40, a piston 42 provided for each integrated circuit and having a semi-spherical surface to be in contact with the integrated circuit, a spring 43 for biasing the piston 42 against the associated integrated circuit, a hat 44 for receiving the pistons 42, an intermediate layer 45 provided on the hat, a cooling plate 46, coolant 47 and helium gas 48.

The piston 42 is biased against a heat radiating surface of the integrated circuit 41 by the spring 43. Heat generated by the integrated circuit 41 is transmitted to the piston 42 through the resilient contact between the latter and the integrated circuit, then to the hat 44 and the intermediate layer 45 through a space filled with helium gas 48. This heat is transmitted from the intermediate layer 45 to the cooling plate 46 and then to the coolant 47.

Figure 9:
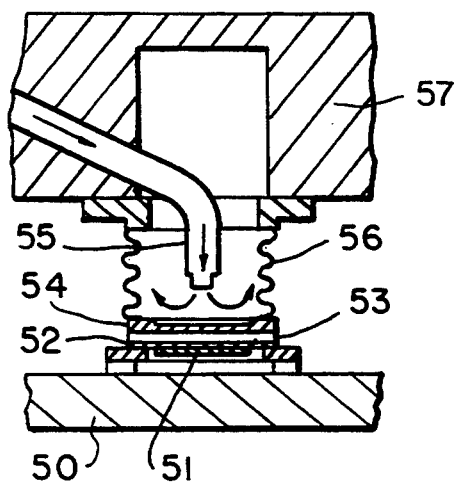
FIG. 9 is a longitudinal cross section of another conventional cooling structure for an integrated circuit.

Referring to FIG. 9 showing another example of a conventional cooling structure, the structure comprises a printed circuit substrate 50, an IC chip 51, a heat conductive substrate 52, a deformable heat conductor 53, a heat conductive plate 54, a nozzle 55, a bellow 56 and a cooling header 57.

Heat generated by the chip 51 on the printed circuit substrate 50 is transmitted through the heat conductive substrate 52, the deformable heat conductor 53 and the heat conductive plate 54. During this heat conduction, liquid coolant is jetted from the nozzle 55 to the heat conductive plate 54 within the bellow 56 to absorb heat and heat absorbed coolant is discharged from the bellow 56 to a path provided within the cooling header 57.

An embodiment of the present invention will be described with reference to the drawings.

Figure 1:
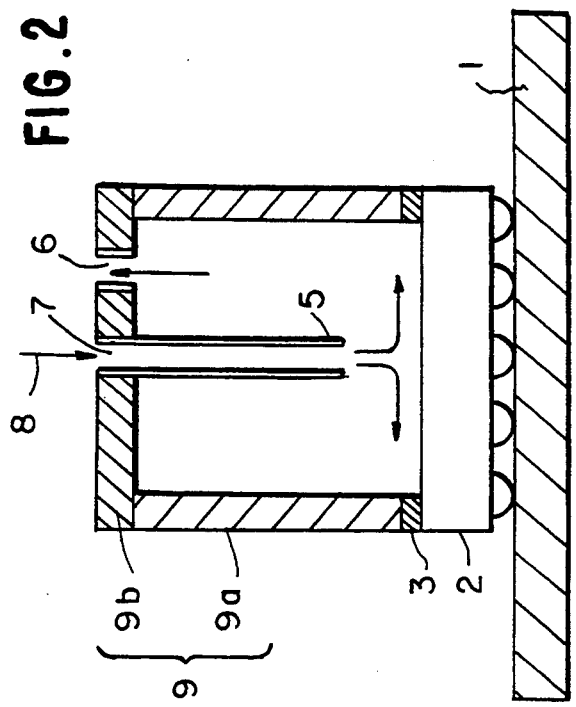
FIG. 1 is a longitudinal cross section of a first embodiment of the present invention.

Referring to FIG. 1, a first embodiment of the present invention comprises a wiring substrate 1, an integrated circuit 2 mounted on the wiring substrate 1, a cooling block 4 having a liquid coolant inlet port 7 and a liquid coolant outlet port 6 in an upper portion thereof and an opening portion in a lower portion thereof. The opening is in opposing relation to a heat radiating surface of the integrated circuit 2. The embodiment further comprises a sealing member 3 provided between the heat radiating surface of the integrated circuit 2 and a periphery of the opening portion of the cooling block 4 and a nozzle 5 extending downwardly from the inlet port 7 of the cooling block 4 for jetting liquid coolant 8 to a heat radiating surface of the integrated circuit 2.

The opening portion of the cooling block 4 is fixed to the heat radiating surface of the integrated circuit 2 mounted on the wiring substrate 1 through the sealing member 3. The integrated circuit 2 may be a chip carrier having a case in which-an LSI is housed or a flip-chip on which an LSI itself is mounted. The sealing member 3 may be of epoxy or silicon adhesive.

Liquid coolant 8 is supplied through the coolant inlet port 7 of the cooling block 4 and jetted through the nozzle 5 to the heat radiating surface of the integrated circuit 2 fixed to the opening portion thereof. Liquid coolant 8 is accumulated within the cooling block 4 while absorbing heat from the heat radiating surface of the integrated circuit 2 and overflowed through the coolant outlet port 6 externally of the cooling block 4.

Therefore, it is possible to directly cool the integrated circuit 2 by liquid coolant 8 without using heat conducting plate, etc.

In this case, since the opening portion of the cooling block 4 is liquid-tightly sealed by the heat radiating surface of the integrated circuit 2 through the sealing member 3, there is no leakage of the liquid coolant 8 onto the wiring substrate 1. Therefore, it is not necessary to use liquid having electrically insulating property as coolant 8. Thus, any liquid such as water which has no electrical insulating property may be used as liquid coolant 8, so long as it has high cooling capability.

According to experiments conducted by the inventors, it has been found that, when water is used as liquid coolant 8 and jetting rate thereof through the nozzle 5 is varied in a range from 0.5 to 3.0 m/s, heat conductivity in a range from 1 to 3 w/cm$^2$° C. is obtained. Further, since the opening portion of the cooling block 4 is fixed through the sealing member 3 to the heat radiating surface of the integrated circuit 2 and liquid coolant 8 is directly jetted to the heat radiating surface, it becomes possible to remove an intermediate member such as air whose heat conductivity is low, heat conductive compound or metal plate, etc. Therefore, it is possible to restrict the heat resistance between an PN junction of the integrated circuit 2 and liquid coolant 8 to a value of 0.5 to 1.0° C./w or less.

Figure 2:
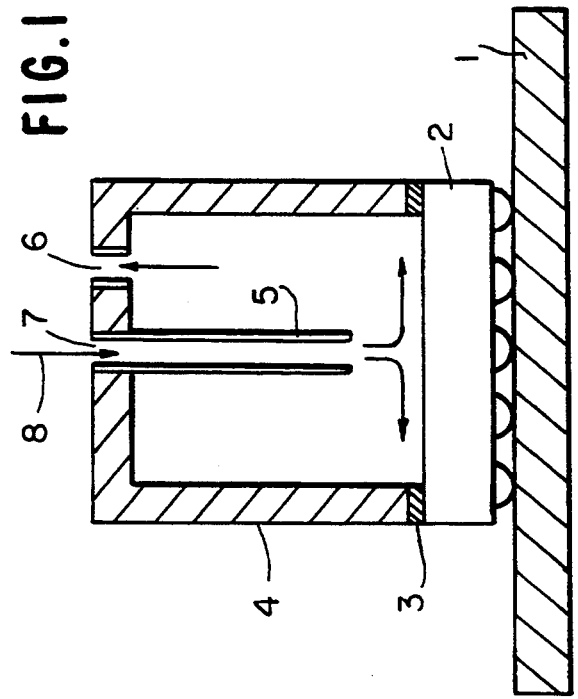
FIG. 2 is a longitudinal cross section of a second embodiment of the present invention.

Referring to FIG. 2 which shows a second embodiment of the present invention, the structure comprises a wiring substrate 1, an integrated circuit 2 mounted on the wiring substrate 1, a cooling block 9 composed of a hollow cylindrical member 9a and a cover member 9b mounted on the cylindrical member 9a and having a coolant inlet port 7 and a coolant outlet port 6 in an upper portion thereof, a sealing member 3 provided between a heat radiating surface of the integrated circuit 2 and the cooling block 9, a nozzle 5 extending downwardly from the inlet port 7 of the cooling block 9 and liquid coolant 8 for cooling the integrated circuit 2. Circulation of the liquid coolant in cooling the integrated circuit is similar to that of the first embodiment.

The cooling block 9 is formed by soldering or brazing the hollow cylindrical member 9a to the cover member 9b or fixedly securing them with using adhesive.

Therefore, in addition to effects similar to those of the first embodiment, the second embodiment facilitates repair and/or exchange of the cooling block since the cover member 9b thereof is easily separated from the cylindrical member 9a.

Figure 3:
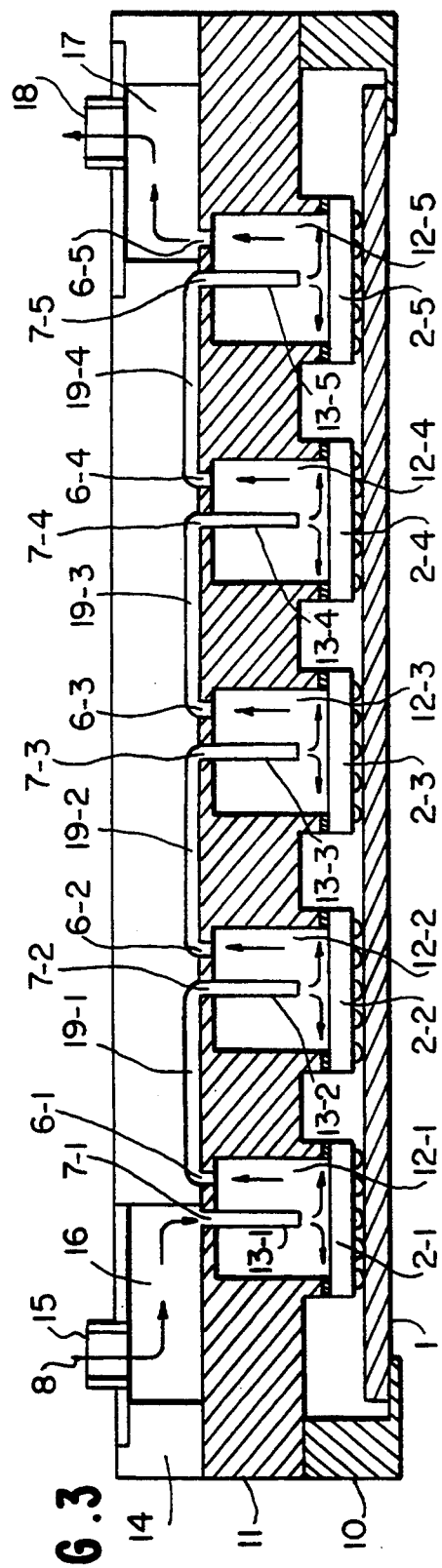
FIG. 3 is a longitudinal cross section of a third embodiment of the present invention.

Referring to FIG. 3 showing a third embodiment of the present invention, the structure comprises a wiring substrate 1, a plurality of integrated circuits 2-1 to 2-5 mounted on the wiring substrate 1 in matrix and a cooling block 11 formed therein with a plurality of coolant accumulator portions 12-1 to 12-5 each having an opening portion in a lower portion thereof. The coolant accumulator portions 12-1 to 12-5 are formed in upper portions of the cooling block 11 with a plurality of coolant inlet ports 7-1 to 7-5 and a plurality of coolant outlet ports 6-1 to 6-5, respectively. Nozzles 13-1 to 13-5 extend downwardly from the coolant inlet ports 7-1 to 7-5, respectively. The wiring substrate 1 is supported at a periphery thereof by a substrate frame 10 such that the heat radiating surfaces of the integrated circuits 2-1 to 2-5 mounted on the wiring substrate 1 are held in liquid-tight contact with the peripheries of the opening portions of the accumulator portions 12-1 to 12-5 through sealing members 3, respectively. The third embodiment further comprises a header 14 having a coolant supply port 15, a coolant conducting path 16, coolant passages 19-1 to 19-4, a coolant discharge path 17 and a coolant discharge port 18. The coolant passages 19-1 to 19-4 are grooves formed in a lower surface of the header 14 each for connecting a coolant outlet port 6 of a preceding accumulator portion 12 to a coolant inlet port 7 of a next accumulator portion 12.

The accumulating portions 12-1 to 12-5 are provided in the cooling block 11 at positions corresponding to the respective integrated circuits 2-1 to 2-5. The cooling block 11 is mounted to the substrate frame 10 with the opening portions of the accumulating portions 12-1 to 12-5 being positioned on upper surfaces of the respective integrated circuits 2-1 to 2-5 on the wiring substance 1 and sealed with the sealing member 3. The coolant inlet ports 7-1 to 7-5 and the coolant discharge ports 6-1 to 6-5 are provided in center portions and end portions of the accumulating portions 12-1 to 12-5 of the cooling block 11, respectively. The nozzles 13-1 to 13-5 are mounted on the coolant inlet ports 7-1 to 7-5 for jetting liquid coolant 8 to center portions of the heat radiating surfaces of the integrated circuits 2-1 to 2-5, respectively.

The header 14 is mounted on the cooling block 11 and has the coolant supply port 15, the coolant conducting path 16, the coolant discharge path 17 and the coolant outlet port 18. That is, liquid coolant 8 from the coolant supply port 15 is branched at the coolant conducting path 16, provided in the vicinity of the coolant supply port 15, into a plurality of cooling paths. Liquid coolant 8 that has passes through these cooling paths are collected in the coolant discharge path 17, provided in the vicinity of the coolant discharge port 18, and discharged therefrom.

The coolant passages formed in the header 14 as the grooves 19-1 to 19-4 connect the coolant outlet port 6-1 of the accumulation portion 12-1 to the coolant inlet port 7-2 of the accumulator portion 12-2, the coolant outlet port 6-2 of the accumulator portion 12-2 to the coolant inlet port 7-3 of the accumulator portion 12-3, the coolant outlet port 6-3 of the accumulation portion 12-3 to the coolant inlet port 7-4 of the accumulator portion 12-4 and the coolant outlet port 6-4 of the accumulator portion 12-4 to the coolant inlet port 7-5 of the accumulator portion 12-5, respectively.

When liquid coolant 8 is supplied from the coolant supply port 15 of the header 14, it fills the coolant conducting path 16 and then jetted by the nozzle 13-1 toward a center portion of the heat radiating surface of the integrated circuit 2-1. Liquid coolant 8 jetted onto the upper surface of the integrated circuit 2-1 fills the accumulator portion 12-1 while absorbing heat and overflows through the coolant outlet port 6-1. Liquid coolant 8 thus overflowed passes through the coolant passage 19-1 to the coolant inlet port 7-2 and jetted toward a center portion of a heat radiating surface of the integrated circuit 2-2.

Liquid coolant jetted to the upper surface of the integrated circuit 2-2 through the nozzle 13-2 is supplied to center portions of heat radiating surfaces of the integrated circuits 2-3, 2-4 and 2-5 through the respective coolant discharge ports 6-2, 6-3 and 6-4, the grooves 19-2, 19-3 and 19-4 and the nozzles 13-3, 13-4 and 13-5, sequentially, in similar manner.

Liquid coolant 8 jetted onto the upper surface of the integrated circuit 2-5 fills the accumulator portion 12-5, overflows through the coolant outlet port 6-5, is collected in the coolant discharge path 17 and then discharged from the coolant outlet port 18.

Thus, heat generated in the integrated circuits 2-1 to 2-5 is absorbed by liquid coolant 8 jetted onto the respective upper surfaces of the integrated circuits.

Therefore, the same effects as those obtained in the first embodiment can be obtained. Further, according to the third embodiment in which the substrate frame 10 is fixed to the wiring substrate 1 on which the plurality of integrated circuits 2-1 to 2-5 are mounted, the upper surfaces of these integrated circuits 2-1 to 2-5 are fixed to the opening portions of the cooling block 11 through the seal member 3, the cooling block 11 is mounted on the substrate frame 10 and the header 14 having the coolant path for directly jetting liquid coolant 8 onto the heat radiating surfaces of the integrated circuits 2-1 to 2-5 through the nozzles 13-1 to 13-5 provided in the cooling block 11 is mounted on the upper portion of the cooling block 11, it is possible to minimize heat resistance between the heat radiating surfaces of the integrated circuits and liquid coolant.

Further, since the opening portions of the cooling block 11 are fixed onto the heat radiating surfaces of the respective integrated circuits 2-1 to 2-5 through the sealing members 3, leakage of liquid coolant 8 onto the wiring substrate 1 can be prevented, causing non-insulating liquid coolant such as water to be able to use.

Figure 4:
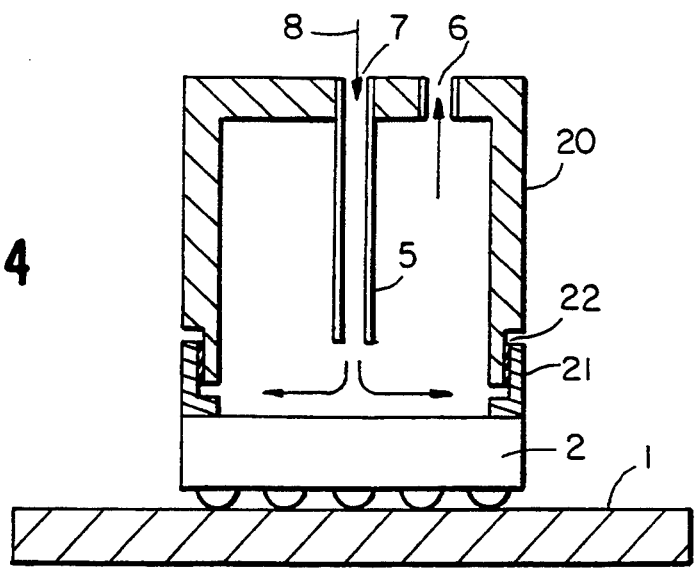
FIG. 4 is a longitudinal cross section of a fourth embodiment of the present invention.

Referring to FIG. 4 showing a fourth embodiment of the present invention, the structure includes a wiring substrate 1, an integrated circuit 2 mounted on the wiring substrate 1, a cooling block 20 having, in an upper portion thereof, a coolant outlet port 6 and a coolant inlet port 7 and, in a lower portion thereof, an opening portion opposing to the integrated circuit 2, a nozzle 5 provided around the coolant inlet port 7 of the cooling block 4 and extending downwardly, a frame member 21 having a lower end fixed to a heat radiating surface of the integrated circuit 2 and an upper end fitted on an outer side surface of the opening portion of the cooling block 20, a sealing member 22 provided between the outer side surface of the opening portion of the cooling block 20 and an inner surface of the frame member 21 and liquid coolant 8 for cooling the integrated circuit 2. Circulation of liquid coolant is similar to that of the first embodiment.

The opening portion of the cooling block 20 is L shaped in cross section which is fitted inside of the frame member 21 as shown. The sealing member 22 provided between the outer surface of the opening portion of the cooling block 20 and the inner surface of the frame 21 connects them liquid-tightly. Material of the sealing member 22 may be epoxy or silicon adhesive or solder may be used alternatively.

In the embodiment shown in FIG. 4, the cooling block 20 may be fitted on an outer surface of the frame 21.

Therefore, the effects obtainable in the fourth embodiment are similar to those obtained in the first embodiment. Further, according to the fourth embodiment in which the outer surface of the opening portion of the cooling block 20 and the inner surface of the frame 21 provided on the heat radiating surface of the integrated circuit 2 are bonded through the sealing member 22, the contact area can be increased.

Further, by regulating a bonding position of the outer surface of the cooling block 20 with respect to the inner surface of the frame 21, it is possible to regulate a distance between the cooling block 20 and the integrated circuit 2. Therefore, it is possible to absorb a variation of distance between the cooling block 20 and the integrated circuit 2.

Further, when the sealing member 22 is of a solder whose melting point is lower than that of a solder used for connecting the integrated circuit 2 to the wiring substrate 1, it is possible to remove the cooling block 20 from or mount it on the integrated circuit 2, without melting the solder used to connect the integrated circuit 2 to the wiring substrate 1.

Figure 5:
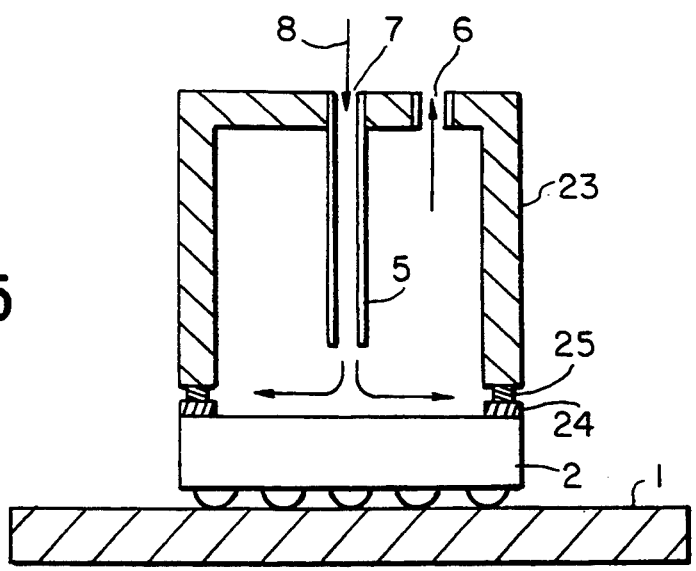
FIG. 5 is a longitudinal cross section of a fifth embodiment of the present invention.

Referring to FIG. 5, a fifth embodiment of the present invention includes a wiring substrate 1, an integrated circuit 2 mounted on the wiring substrate 1, a cooling block 23 having, in an upper portion thereof, a coolant outlet port 6 and a coolant inlet port 7 and, in a lower portion, an opening portion opposing to the integrated circuit, a nozzle 5 provided around the coolant inlet port 7 of the cooling block 23 and extending downwardly, a frame 24 fixed to a heat radiating surface of the integrated circuit 2 for supporting the opening portion of the cooling block 23 through a packing 25 and liquid coolant 8 for cooling the integrated circuit 2. Circulation of liquid coolant is similar to that of the first embodiment.

The packing 25 is of a soft material such as rubber, so that, by pressing the cooling block 23 towards the integrated circuit 2, the opening portion of the cooling block 23 is liquid-tightly fixed to the frame 24. The pressing of the cooling block 23 to the integrated circuit 2 may be realized by putting a weight on an upper surface of the cooling block 23.

Thus, in addition to the effects similar to those obtained-in the first embodiment, the fifth embodiment can prevent liquid coolant 8 accumulated inside the cooling block 23 from leaking out onto such as the wiring substrate 1.

By further providing annular grooves in an end portion of the opening portion of the cooling block 23 and on an upper surface of the frame 24, respectively, it is possible to hold the packing 25 stably in place, resulting in an improved sealing between the cooling block 23 and the frame 24. Alternatively, the packing 25 may be preliminarily bonded to either the opening portion of the cooling block 23 or the upper surface of the frame 24.

Further, in the fifth embodiment in which the packing 25 is provided between the opening portion of the cooling block 23 and held in its place by pressing the cooling block 23 toward the integrated circuit 2, the cooling block 23 can be easily detached from the integrated circuit 2.

Figure 6:
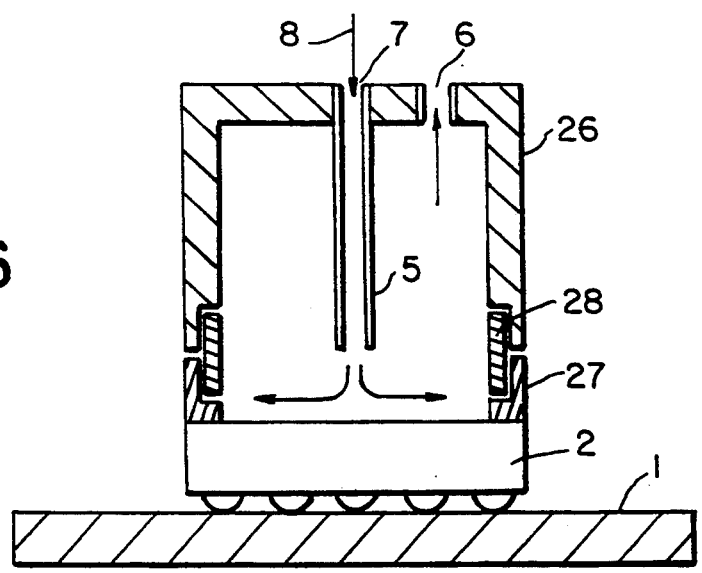
FIG. 6 is a longitudinal cross section of a sixth embodiment of the present invention.

Referring to FIG. 6, a sixth embodiment of the present invention includes a wiring substrate 1, an integrated circuit 2 mounted on the wiring substrate 1, a cooling block 26 having, in an upper portion thereof, a coolant outlet port 6 and a coolant inlet port 7 and, in a lower portion thereof, an opening portion opposing to the integrated circuit 2, a nozzle 5 provided around the coolant inlet port 7 of the cooling block 26 and extending downwardly, a frame 27 having a lower end fixed to a heat radiating surface of the integrated circuit 2 and an upper end connected the opening portion of the cooling block 26, a seal ring 28 provided between inner side surfaces of connecting portions of the opening portion of the cooling block 26 and the frame 27 and liquid coolant 8 for cooling the integrated circuit 2. Circulation of liquid coolant is similar to that of the first embodiment.

The opening portion of the cooling block 26 is L shaped in cross section. The frame 27 having an L shaped cross section is fixed on the heat radiating surface of the integrated circuit 2. The seal ring 28 is provided in an annular inner groove formed by the cooling block 26 and the frame 27 when they are assembled.

The seal ring 28 is of a soft material such as rubber so that it is urged against the connecting portions of the cooling block 26 and the frame 27 by increased inner pressure of the cooling block 26 caused by liquid coolant 8 supplied thereto through the coolant inlet port 7.

Therefore, in addition to the effects similar to those obtained in the first embodiment, the effect of leakage prevention of liquid coolant 8 accumulated in the cooling block 26 to the wiring substrate 1, etc., is improved since the seal ring 28 seals the inside connecting portions of the cooling block 26 and the frame 27. The seal ring 28 may be bonded to the inside surface of the opening portion of the cooling block 26 or the frame 27.

Further, since the opening portion of the cooling block 26 and the frame 27 are not fixed to each other by such as adhesive, the cooling block 26 can be easily removed from the integrated circuit 2.

Figure 7:
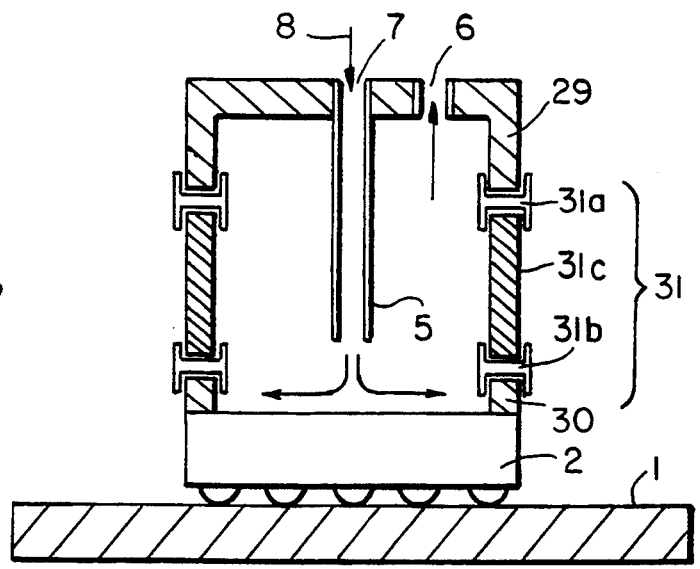
FIG. 7 is a longitudinal cross section of a seventh embodiment of the present invention.

Referring to FIG. 7 showing a seventh embodiment of the present invention the structure includes a wiring substrate 1, an integrated circuit 2 mounted on the wiring substrate 1, a cooling block 29 having, in an upper portion thereof, a coolant outlet port 6 and a coolant inlet port 7 and, in a lower portion thereof, an opening portion opposing to the integrated circuit, a nozzle 5 provided around the coolant inlet port 7 of the cooling block 29 and extending downwardly, a frame 30 fixed to a heat radiating surface of the integrated circuit 2, a joint member 31 for connecting the opening portion of the cooling block 29 and the frame 30 and liquid coolant 8 for cooling the integrated circuit 2. Circulation of liquid coolant is similar to that of the first embodiment.

The joint member 31 is composed of connecting parts 31a and 31b whose cross sections are H shaped and a seal ring 31c arranged between the connecting parts 31a and 31b. The seal ring 31c is of a soft material such as rubber and bonded to the connecting parts 31a and 31b by means of sealing material or adhesive, respectively.

Therefore, in addition to the effects obtained in the first embodiment, the seventh embodiment has an effect that a misalignment between the cooling block 29 and the integrated circuit 2 and variation in height thereof can be absorbed since the joint member 31 itself is flexible. When the seal ring 31 is preliminarily bonded to the opening portion of the cooling block 29 or an upper surface of the frame 30, it may be possible to remove one of the connecting parts 31a and 31b.

In any of the described embodiments, the cooling block may take any other configuration than a cylinder, such as rectangular parallelepiped configuration. Further, although the coolant passages for supplying coolant to and discharging from the accumulator portions 12-1 to 12-5 of the cooling block are formed by the header 14 formed with the coolant conducting path 16, the coolant discharge path 17 and the grooves 19-1 to 19-5, it may be possible to provided a separate coolant path for circulating liquid coolant 8 to each of the accumulator portions 12-1 to 12-5.

As described hereinbefore, with the present cooling structure in which the opening portion of the cooling block and the the heat radiating surface of the integrated circuit are fixed to each other by the sealing member and the heat radiating surface is jetted with liquid coolant through the nozzle provided in the cooling block, it is possible to minimize heat resistance between the integrated circuit and liquid coolant.

While the present invention has been described in conjunction with the preferred embodiments thereof, it will now be readily possible for those skilled in the art to put this invention into practice in various other manners.

What is claimed is:

1. A cooling structure for an integrated circuit, comprising:
    a wiring substrate;
    an integrated circuit mounted on said wiring substrate, and having an upper major surface and a lower major surface, said lower major surface provided with electrodes;

a frame bonded to said upper major surface of said integrated circuit;

a cooling block having a liquid coolant inlet port and a liquid coolant discharge port in an upper portion thereof and an opening portion in a lower end portion thereof, for accumulating liquid coolant therein, said opening portion connected to said frame;

means for fixing an outer side surface of said opening portion of said cooling block to an inner side surface of said frame with said opening portion being fitted in said frame; and jetting means, in said cooling block, for directly jetting said liquid coolant to said upper major surface of said integrated circuit.

2. A cooling structure for an integrated circuit, comprising:

a wiring substrate;

an integrated circuit mounted on said wiring substrate, and having an upper major surface and a lower major surface, said lower major surface provided with electrodes;

a frame bonded to said upper major surface of said integrated circuit;

a cooling block having a liquid coolant inlet port and a liquid coolant discharge port in an upper portion thereof and an opening portion in a lower end portion thereof, for accumulating liquid coolant therein, said opening portion connected to said frame;

a packing being placed between said opening portion of said cooling block and said frame; and jetting means, in said cooling block, for directly jetting said liquid coolant to said upper major surface of said integrated circuit.

3. A cooling structure for an integrated circuit, comprising:

a wiring substrate;

an integrated circuit mounted on said wiring substrate, and having an upper major surface and a lower major surface, said lower major surface provided with electrodes;

a frame bonded to said upper major surface of said integrated circuit;

a cooling block having a liquid coolant inlet port and a liquid coolant discharge port in an upper portion thereof and an opening portion in a lower end portion thereof, for accumulating liquid coolant therein, said opening portion connected to said frame;

a seal ring for connecting said opening portion of said cooling block and said frame in alignment with said opening portion and covering an inside portion of a connection between said opening portion and said frame; and jetting means, in said cooling block, for directly jetting said liquid coolant to said upper major surface of said integrated circuit.

4. A cooling structure for an integrated circuit, comprising:

a wiring substrate;

an integrated circuit mounted on said wiring substrate, and having an upper major surface and a lower major surface, said lower major surface provided with electrodes;

a frame bonded to said upper major surface of said integrated circuit;

a cooling block having a liquid coolant inlet port and a liquid coolant discharge port in an upper portion thereof and an opening portion in a lower end portion thereof, for accumulating liquid coolant therein, said opening portion being arranged on said frame;

a joint member being arranged between said cooling portion and said frame, for connecting at one end portion thereof to said opening portion of said cooling block and at another end portion thereof to said frame; and jetting means, in said cooling block, for directly jetting said liquid coolant to said upper major surface of said integrated circuit.

5. A cooling structure for an integrated circuit according to claim 1, wherein said fixing means comprises a sealing member that liquid-tightly seals said opening portion to said frame.

6. A cooling structure for an integrated circuit according to claim 1, wherein said jetting means comprises a nozzle.

7. A cooling structure for an integrated circuit according to claim 2, wherein said packing liquid-tightly seals said opening portion to said frame.

8. A cooling structure for an integrated circuit according to claim 2, wherein said jetting means comprises a nozzle.

9. A cooling structure for an integrated circuit according to claim 2, further comprises at least one annular groove being formed in a bottom surface of said opening portion of said integrated circuit and a top surface of said frame.

10. A cooling structure for an integrated circuit according to claim 3, wherein said jetting means comprises a nozzle.

11. A cooling structure for an integrated circuit according to claim 3, wherein said seal ring is disposed in an annular inner groove formed by said cooling block and said frame when said cooling block and said frame are connected.

12. A cooling structure for an integrated circuit according to claim 4, wherein said jetting means comprises a nozzle.

13. A cooling structure for an integrated circuit according to claim 4, wherein said joint member further comprises a seal ring disposed between said upper portion of said joint member and said lower portion of said joint member.

* * * * *

UNITED STATES PATENT AND TRADEMARK OFFICE
CERTIFICATE OF CORRECTION

PATENT NO.   : 5,436,501
DATED        : July 25, 1995
INVENTOR(S)  : Hironobu IKEDA It is certified that error(s) appears in the above-identified patent and that said Letters Patent is hereby corrected as shown below:

Col. 5, line 16, delete "passes" and insert --passed--.

Signed and Sealed this

Thirtieth Day of January, 1996

Attest:

BRUCE LEHMAN

Attesting Officer    Commissioner of Patents and Trademarks